US010667102B2

(12) United States Patent
Fort

(10) Patent No.: US 10,667,102 B2
(45) Date of Patent: May 26, 2020

(54) DATA DETECTOR

(71) Applicant: Qorvo US, Inc., Greensboro, NC (US)

(72) Inventor: Andrew Fort, Kessel Lo (BE)

(73) Assignee: Qorvo US, Inc., Greensboro, NC (US)

( * ) Notice: Subject to any disclaimer, the term of this patent is extended or adjusted under 35 U.S.C. 154(b) by 240 days.

(21) Appl. No.: 15/825,294

(22) Filed: Nov. 29, 2017

(65) Prior Publication Data

US 2019/0166450 A1    May 30, 2019

(51) Int. Cl.
| | |
|---|---|
| *H04W 4/70* | (2018.01) |
| *H04B 5/00* | (2006.01) |
| *H04W 4/80* | (2018.01) |
| *H03M 1/00* | (2006.01) |
| *H04L 12/28* | (2006.01) |

(52) U.S. Cl.
CPC ............ *H04W 4/70* (2018.02); *H04B 5/0031* (2013.01); *H04W 4/80* (2018.02); *H03M 1/001* (2013.01); *H04L 12/2803* (2013.01)

(58) Field of Classification Search
CPC ........ H04W 4/70; H04W 4/80; H04B 5/0031; H04L 12/2803; H03M 1/001
USPC ......................................................... 375/134
See application file for complete search history.

(56) References Cited

U.S. PATENT DOCUMENTS

| | | | |
|---|---|---|---|
| 5,831,981 A | 11/1998 | Tanimura et al. | |
| 7,974,647 B2* | 7/2011 | Ho ..................... | H04W 56/0015 455/502 |
| 8,041,505 B2* | 10/2011 | Pierce ................ | H04N 21/2662 701/408 |
| 8,531,981 B2 | 9/2013 | Van Driest et al. | |
| 9,912,512 B2* | 3/2018 | Zhao ....................... | H04L 27/14 |
| 2018/0131476 A1 | 5/2018 | Van Driest et al. | |
| 2018/0324829 A1 | 11/2018 | Van Driest et al. | |

FOREIGN PATENT DOCUMENTS

WO    2018004332 A1    1/2018

OTHER PUBLICATIONS

Author Unknown, "Core System Package [Low Energy Controller volume]," Specification of the Bluetooth System, vol. 6, Version 4.2, Dec. 2, 2014, 192 pages.
Fort, Andrew, et al., "A Performance Complexity Comparison of Auto-correlation and Cross-correlation for OFDM Burst Synchronization," International Conference on Acoustics, Speech, and Signal Processing, Apr. 6-10, 2003, Hong Kong, China, IEEE, pp. 341-344, 2003.

* cited by examiner

*Primary Examiner* — Juan A Torres
(74) *Attorney, Agent, or Firm* — Withrow & Terranova, P.L.L.C.

(57) ABSTRACT

A data detector is disclosed. The data detector includes a memory and processing circuitry interfaced with the memory. The processing circuitry is configured to receive a digital signal representative of a radio frequency signal in the digital domain. The processing circuitry generates a frequency offset estimate derived from the digital signal and outputs the frequency offset to the memory and in turn receives output from the memory a set of coefficients that corresponds to the frequency offset estimate. The processing circuitry then performs a complex correlation between the digital signal and the set of coefficients to determine a maximum peak correlation.

25 Claims, 9 Drawing Sheets

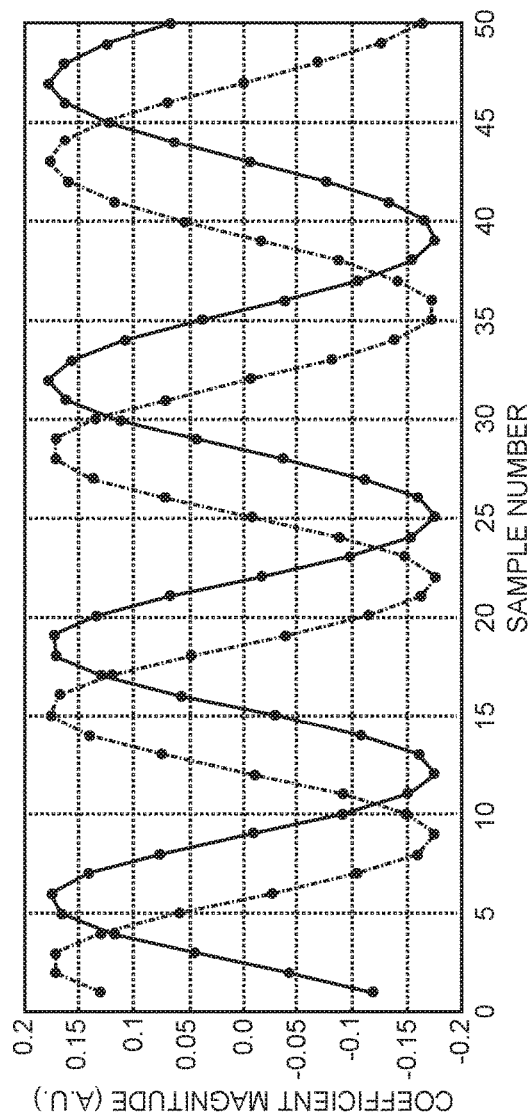
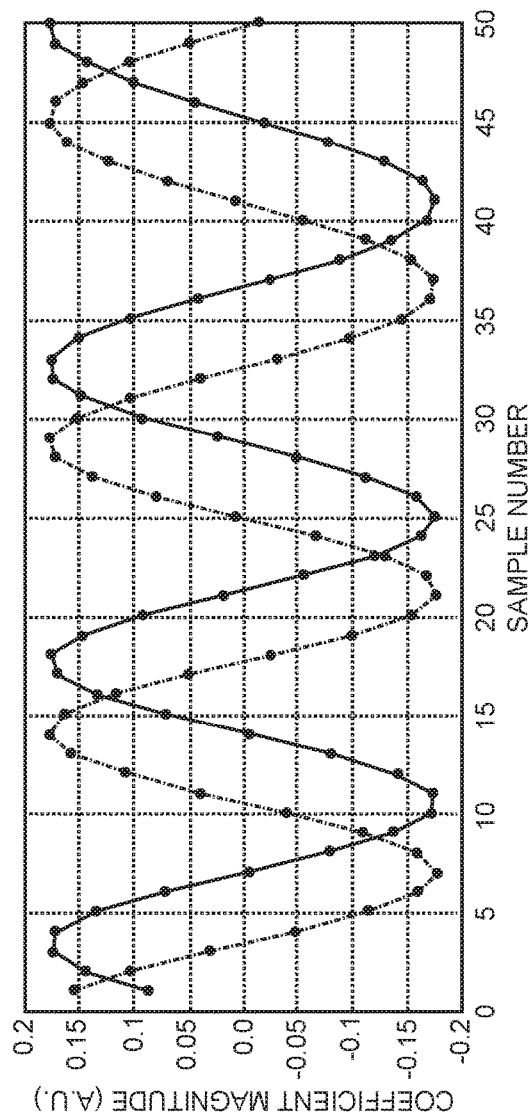
FIG. 3
FIG. 4

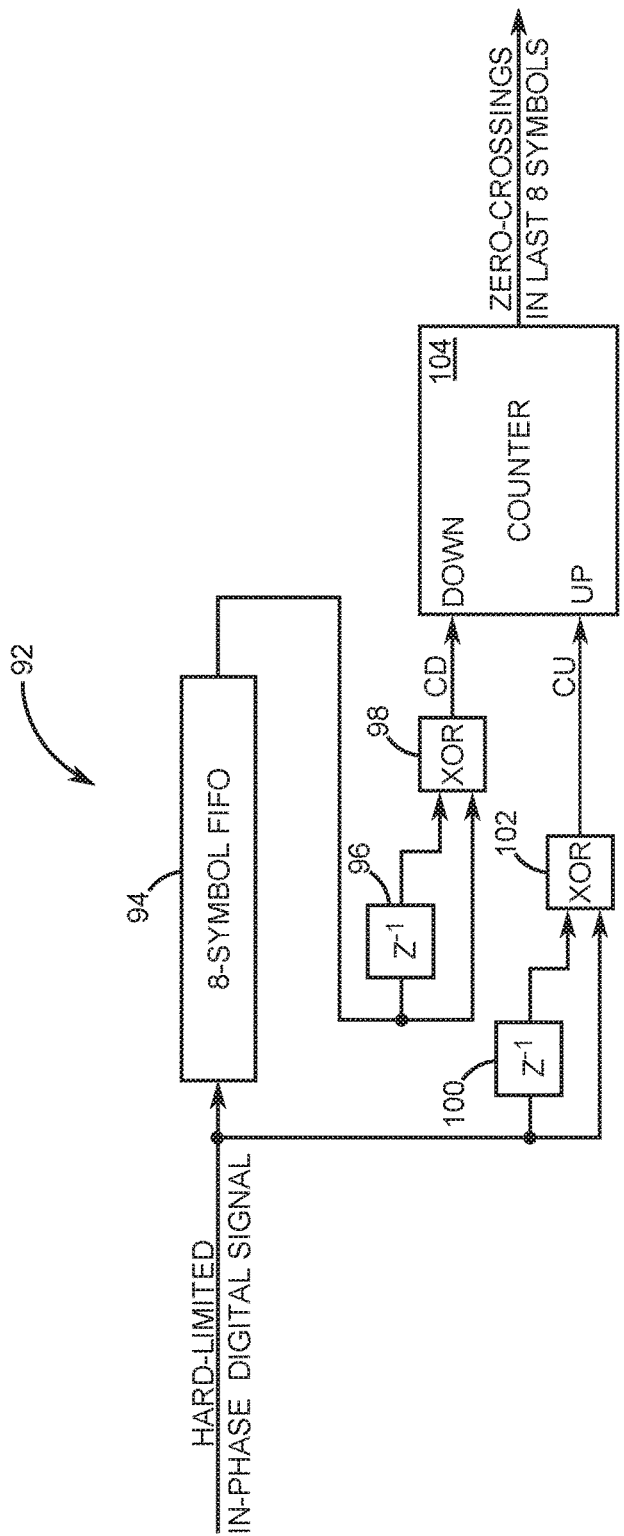

DATA DETECTOR

FIELD OF THE DISCLOSURE

The present disclosure is related to a receiver and method for detecting and recovering digital data transmitted and received in radio frequency noisy environments.

BACKGROUND

Bluetooth Low Energy (BLE) is emerging as one of the important radio technologies enabling the Internet of things and home automation. However, BLE only serves to compliment and co-operate with existing household radio systems. For example, ZigBee exists already in set-top boxes and can be configured to provide coverage over an entire home via its low-power mesh networking capabilities. BLE compliments this service by providing users with an ability to easily control smart home functions from their smartphone. In addition, traditional services such as Wireless Fidelity (Wi-Fi), wireless remote control systems, and wireless telephone systems will continue to play a huge role in the home radio environment.

At the same time, BLE home automation radio systems are found both in smart phones and a wide variety of home automation device nodes such as light bulb switches and sensor devices. For flexibility and ease of installation, these radio systems operate on small coin cell batteries. Thus, BLE radio systems geared towards home automation need to function properly in a radio environment with significant radio interference from other systems. Moreover, BLE radio systems need to achieve the desired performance at low cost and using low-power communications techniques.

Most of the power consumed during digital baseband signal processing by a BLE system typically occurs during packet detection and synchronization of incoming BLE packets. Thus, there is a need for a new low-complexity and low-power method for packet synchronization that achieves higher performance in practical BLE environments.

SUMMARY

A data detector is disclosed. The data detector includes a memory and processing circuitry interfaced with the memory. The processing circuitry is configured to receive a digital signal representative of a radio frequency signal in the digital domain. The processing circuitry generates a frequency offset estimate derived from the digital signal and outputs the frequency offset to the memory and in turn receives output from the memory a set of coefficients that corresponds to the frequency offset estimate. The processing circuitry then performs a complex correlation between the digital signal and the set of coefficients to determine a maximum peak correlation.

An exemplary receiver that employs the data detector is also disclosed. The exemplary receiver has an in-phase path that includes a first analog-to-digital converter that generates the digital in-phase signal and a quadrature path that includes a second analog-to-digital converter that generates the digital quadrature signal. In an exemplary embodiment, a processor system includes a baseband processor configured to communicate with the receiver and recover data that has been detected by the data detector. Yet another exemplary receiver employs a hard limiter that quantizes an incoming analog signal to logic 1 and logic 0 values. In such cases, all quadrature coefficients and/or in-phase coefficients are 1-bit valued as either logic 1 or logic 0.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 3 is a plot of a set of in-phase coefficients and a set of quadrature coefficients that both correspond to a frequency offset of 0 kHz.

FIG. 4 is a plot of a set of in-phase coefficients and a set of quadrature coefficients that both correspond to a frequency offset of −245 kHz.

FIG. 10 is a block diagram of an exemplary zero-crossing counter that is employed to eliminate a frequency ambiguity associated with a 250 kHz carrier frequency offset.

FIG. 11 is a table that provides a mathematical relationship between zero-crossings and carrier frequency offset (CFO) along with exemplary CFOs and expected zero-crossings for exemplary frequencies.

DETAILED DESCRIPTION

Figure 1:
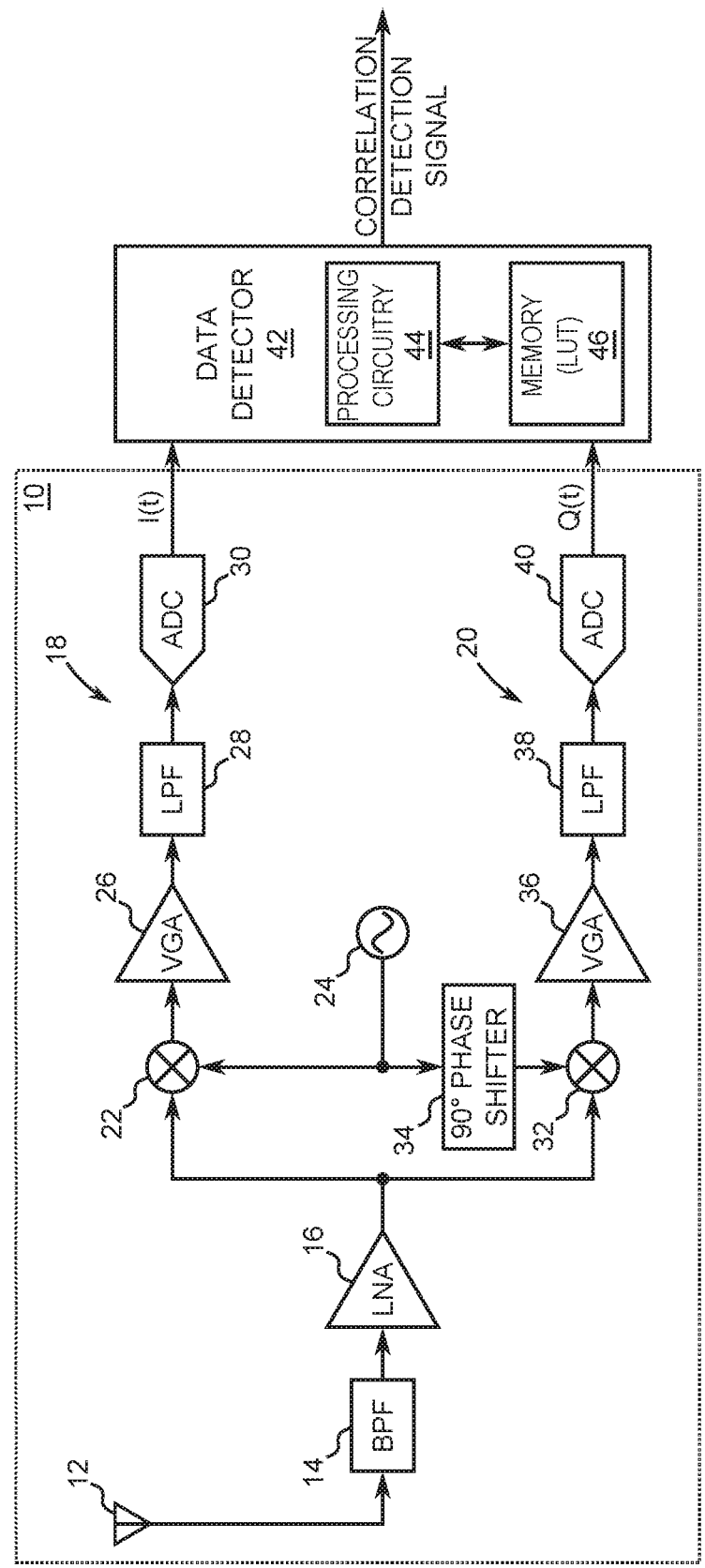
FIG. 1 is a diagram of an exemplary embodiment of a receiver interfaced with a data detector that is configured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Bluetooth Low Energy (BLE) is an important emerging technology in the Internet of things and home automation. However, for successful integration into the home, BLE radios must co-exist with interference from a variety of other existing home radio technologies including Wireless Fidelity (Wi-Fi) and ZigBee, as well as common household appliances that emit interference and noise in the 2.4 GHz band such as microwave ovens. Furthermore, as battery lifetime is critical for home automation systems, this robust co-existence must be achieved at low power. This disclosure provides a low-power system and method for reliably synchronizing to BLE packets in the presence of continuous wave and other types of radio interference.

FIG. 1 is a diagram of an exemplary embodiment of a receiver 10 that is configured in accordance with the present disclosure. In at least this exemplary embodiment, the receiver 10 is configured to receive a BLE radio frequency (RF) signal that arrives at an antenna 12. A bandpass filter (BPF) 14 coupled to the antenna 12 attenuates signals outside of a passband for the BLE RF signal. A low-noise amplifier (LNA) 16 provides gain to the BLE RF signal before the BLE RF signal is divided between an in-phase path 18 and a quadrature path 20.

The in-phase path 18 includes a first mixer 22 coupled to an output of the LNA 16. The first mixer 22 mixes a first portion of the BLE RF signal with a local oscillator signal generated by a local oscillator 24 to generate a first intermediate frequency (IF) signal. A first variable gain amplifier (VGA) 26 provides constant gain to the first IF signal. A first low-pass filter (LPF) 28 is coupled to an output of the first VGA 26 to attenuate undesirable higher frequency components from the first IF signal, thereby producing a first downconverted signal. A first analog-to-digital converter (ADC) 30 coupled to an output of the first LPF 28 converts the first downconverted signal into a digital in-phase signal I(t). It is to be understood that in some embodiments, the BLE RF signal is downconverted to baseband.

The quadrature path 20 includes a second mixer 32 coupled to the output of the LNA 16. The second mixer 32 mixes a second portion of the BLE RF signal with a 90° phase shifted version of the local oscillator signal generated by the local oscillator 24 and phase shifted by a 90° phase shifter 34 to generate a second IF signal. A second VGA 36 provides constant gain to the second IF signal. An LPF 38 is coupled to an output of the second VGA 36 to filter undesirable higher frequency components from the second IF signal, thereby producing a second downconverted signal. A second ADC 40 coupled to an output of the LPF 38 converts the second downconverted signal into a digital quadrature signal Q(t).

A data detector 42 receives the digital in-phase signal I(t) and the digital quadrature signal Q(t). The data detector 42 includes processing circuitry 44 and memory 46 with a coefficient lookup table (LUT) that are configured to detect an arrival of a preamble for a BLE data stream carried by the BLE RF signal. A correlation detection signal generated by the data detector 42 in response to the digital in-phase signal I(t) and the digital quadrature signal Q(t) is used by related-art elements (not shown) of the receiver 10 to synchronize acquisition of digital data that typically follows the digital preamble. It is to be understood that the data detector 42 is not limited to detecting digital data streams from a particular standard such as BLE but is also employable to detect digital data streams of high-level communication protocols such as Zigbee, Z-wave, and Wi-Fi.

Figure 2:
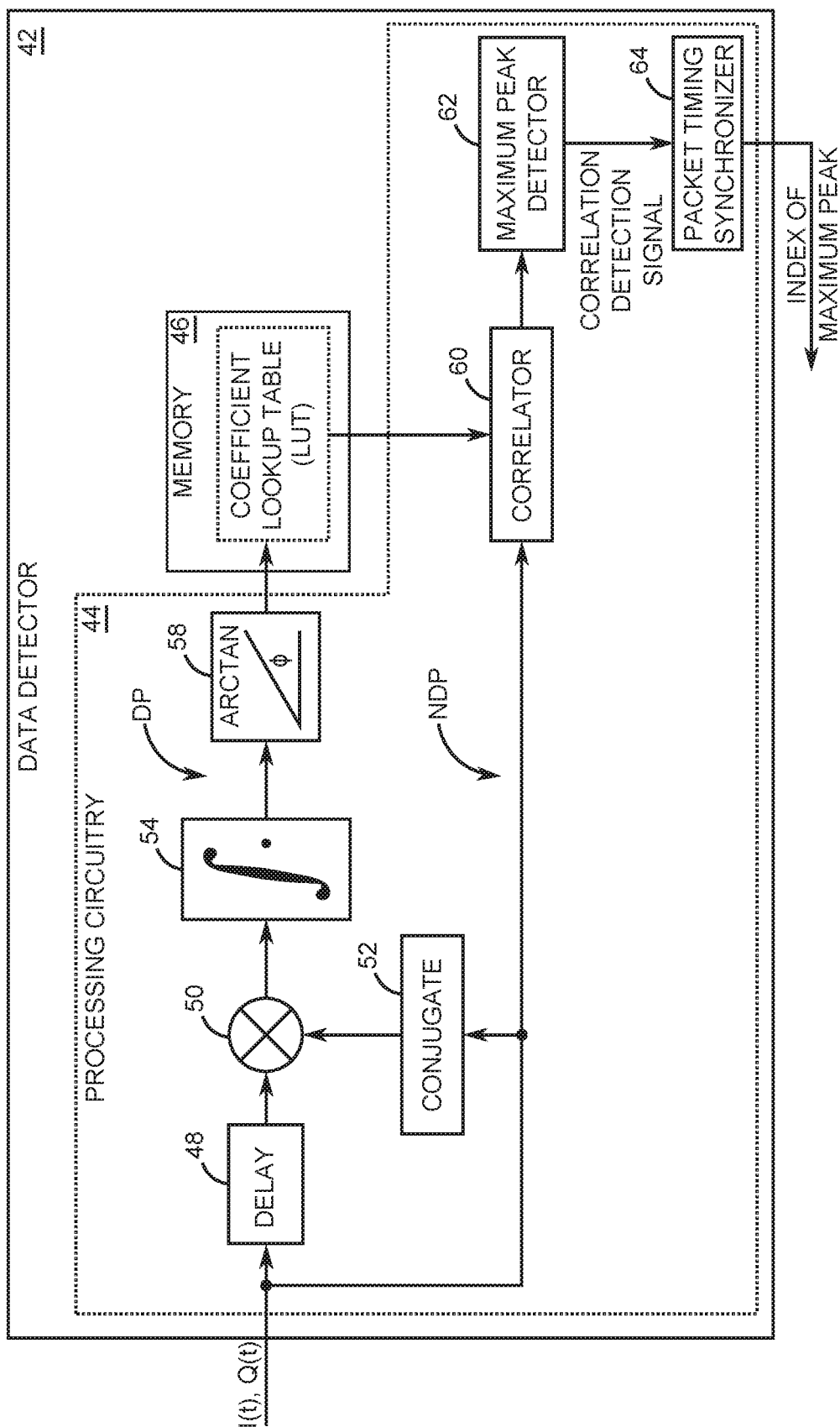
FIG. 2 is a symbolic diagram of an exemplary embodiment of the data detector included with the receiver of FIG. 1.

FIG. 2 is a symbolic diagram of a first embodiment of the data detector 42. The digital in-phase signal I(t) and the digital quadrature signal Q(t) traverse both a delayed path DP and a non-delayed path NDP. The delayed path DP includes a delay 48 that delays the digital in-phase signal I(t) and the digital quadrature signal Q(t) by a fixed delay. In an exemplary embodiment the fixed delay is equal to 2 µs, which is an amount in time occupied by two symbols of a BLE preamble made up of eight bits of alternating ones and zeros. Two symbols correspond to the period of the preamble provided by the BLE standard. This symbol delay is expected to be different for other standards and would correspond to, for example, a Zigbee preamble period.

A complex multiplier function 50 receives delayed versions of the digital in-phase signal I(t) and the digital quadrature signal Q(t) that are delayed by the fixed amount provided by the delay 48. A conjugate function 52 provides the complex multiplier function 50 with a conjugated version of the digital in-phase signal I(t) and the digital quadrature signal Q(t). The complex multiplier function 50 then multiplies the delayed versions of the digital in-phase signal I(t) and the digital quadrature signal Q(t) by the conjugated version of the digital in-phase signal I(t) and the digital quadrature signal Q(t) to generate multiplied versions of the digital in-phase signal I(t) and the digital quadrature signal Q(t). In general, the complex multiplier function 50 works with complex I and Q samples. Unless otherwise stated, all multiplications described in this document are complex, for example, (I1+jQ1)*(I2+jQ2).

In exemplary embodiments, an integrator function 54 integrates the multiplied versions of the digital in-phase signal I(t) and the digital quadrature signal Q(t) over a time interval equal to the BLE preamble, resulting in integrated versions of the digital in-phase signal I(t) and the digital quadrature signal Q(t). An arctangent (ARCTAN) function 58 provides a frequency offset estimate for the BLE RF signal by calculating the arctangent of the integrated versions of the multiplied versions of the digital in-phase signal I(t) and the digital quadrature signal Q(t). In one embodiment, the ARCTAN function 58 is implemented using an arctangent lookup table where I/O samples are addressed within the memory 46 having arctangent values that correspond to each of the I/O samples.

The memory 46 stores the coefficient LUT with sets of in-phase coefficients and quadrature coefficients that span frequency offsets expected for the BLE RF signal. Each set of in-phase coefficients and each set of quadrature coefficients correspond to the expected preamble at a particular frequency offset. For example, FIG. 3 is a plot of a set of in-phase coefficients represented by dots along a solid modulate signal and a set of quadrature coefficients represented by dots along a dashed and dotted modulate signal that both correspond to the BLE preamble at a frequency offset of 0 kHz. For comparison, FIG. 4 is a plot of a set of in-phase coefficients represented by dots along a solid modulate signal and a set of quadrature coefficients represented by dots along a dashed and dotted modulate signal that both correspond to the BLE preamble at a frequency offset of −245 kHz. FIG. 3 and FIG. 4 show 50 samples out of 256 samples for each set of in-phase coefficients and set of quadrature coefficients that represent an expected in-phase data signal and an expected quadrature data signal at an example IF frequency of 2 MHz, respectively. In an exemplary embodiment, the expected in-phase data signal and the expected quadrature data signal make up at least a portion of a preamble for a BLE packetized data stream.

Referring back to FIG. 2, in an exemplary embodiment, the digital in-phase signal I(t) and the digital quadrature signal Q(t) are each sampled at 32 MHz. As a result, the memory 46 for that particular exemplary embodiment stores 256 data points per each set of in-phase coefficients and each set of quadrature coefficients. However, it is to be understood that the data detector 42 is not limited to a particular radio front-end or particular receiver such a receiver 10. Instead, it is envisioned that other exemplary embodiments that are desirable for simplicity and speed receive hard-limited samples of the digital in-phase signal I(t) and the digital quadrature signal Q(t). In these exemplary embodiments, analog-to-digital function is accomplished with a hard limiter that quantizes an incoming analog signal to logic 1 and logic 0 values. In such cases, all quadrature coefficients and/or in-phase coefficients are 1-bit valued as either logic 1 or logic 0.

In an exemplary embodiment, the memory 46 holds sets of in-phase coefficients and quadrature coefficients for frequency offsets spanning frequencies between −250 kHz and +250 kHz, which is the maximum allowable frequency offset for BLE. However, it is to be understood that other frequency ranges may be more appropriate for other standards. The number of frequency offsets stored within the memory 46 depends on accuracies of time-bases (e.g., crystals) used in a transmitter (not shown) in communication with a receiver 10 (FIG. 1). In one exemplary embodiment, the number of frequency offsets is 15. In response to the frequency offset estimate provided by the ARCTAN function 58, the memory 46 provides an output made up of a set of in-phase coefficients and a set of quadrature coefficients that correspond to the frequency offset estimate. A correlator function 60 receives coefficients from the memory 46 while receiving the digital in-phase signal I(t) and the digital quadrature signal Q(t), which the correlator function 60 correlates with the coefficients.

A maximum peak detector function 62 receives correlation output generated by the correlator function 60 and in response generates a correlation detection signal that indicates a maximum correlation between the coefficients and the digital in-phase signal I(t) and the digital quadrature signal Q(t). The correlation detection signal is received by a packet timing synchronizer function 64 that provides timing for data recovery from the digital in-phase signal I(t) and the digital quadrature signal Q(t). In an exemplary embodiment, the packet timing synchronizer function 64 passes an index of the maximum peak to a data packet recovery routine that is executed by a baseband processor (not shown).

Figure 5:
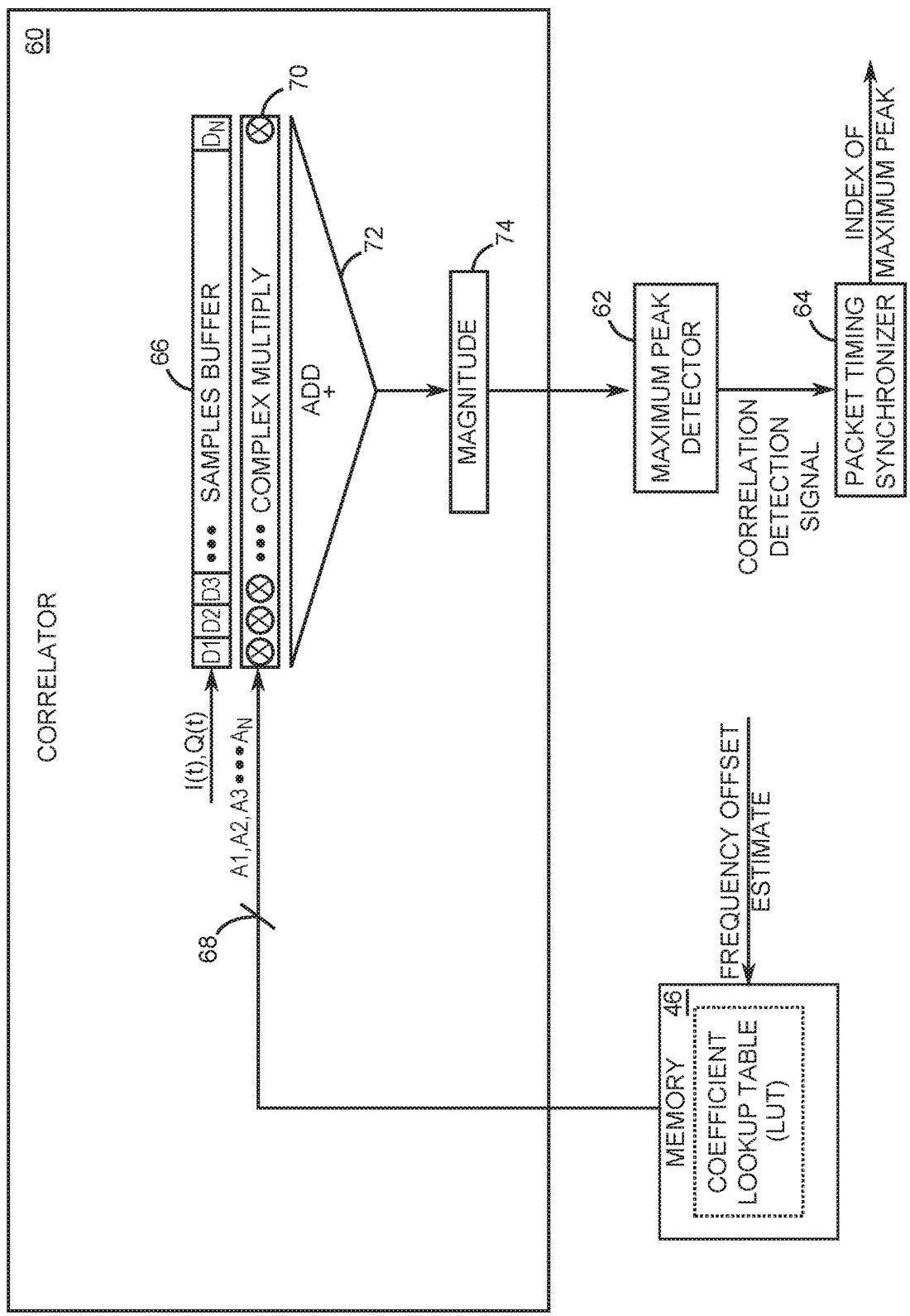
FIG. 5 is a block diagram that provides additional details of a correlator.

FIG. 5 is a block diagram that provides additional details of the correlator function 60. In one embodiment, a samples buffer 66 temporarily stores complex samples $D1$-$D_N$ of the digital in-phase signal I(t) and the digital quadrature signal Q(t) received by the correlator function 60. Complex coefficients $A1$-$A_N$ from the coefficient LUT are received altogether by the correlator function 60 over a parallel bus 68. A complex multiply function 70 complex multiplies each complex sample $D1$-$D_N$ by corresponding complex coefficients $A1$-$A_N$ to generate in-phase products and quadrature products. For example, the complex sample D2 is complex multiplied by the complex coefficient A2, the complex sample D3 is complex multiplied by the complex coefficient A3, and the complex sample $D_N$ is multiplied by the complex coefficient $A_N$.

In greater detail, the complex sample D1 equals (DI1+jDQ1), wherein DI1 is the real part of the complex sample D1 and jDQ1 is the imaginary part of the complex sample D1. Similarly, the complex coefficient A1 equals (AI1+jAQ1), wherein AI1 is the real part of the complex coefficient A1 and jAQ1 is the imaginary part of the complex coefficient A1. Thus, the complex multiplication of the complex sample D1 by the complex coefficient A1 is equal to (DI1+jDQ1)*(AI1+jAQ1).

An adder function 72 performs a complex summation of the in-phase products and the quadrature products, and a magnitude function 74 determines the magnitude of the complex summation of the in-phase products and the quadrature products. The magnitude function 74 provides the magnitude to the maximum peak detector function 62. In turn, the maximum peak detector function 62 determines a maximum peak of the magnitude as the digital in-phase signal I(t) and the digital quadrature signal Q(t) are continuously correlated with coefficients passed to the parallel bus 68.

Figure 6:
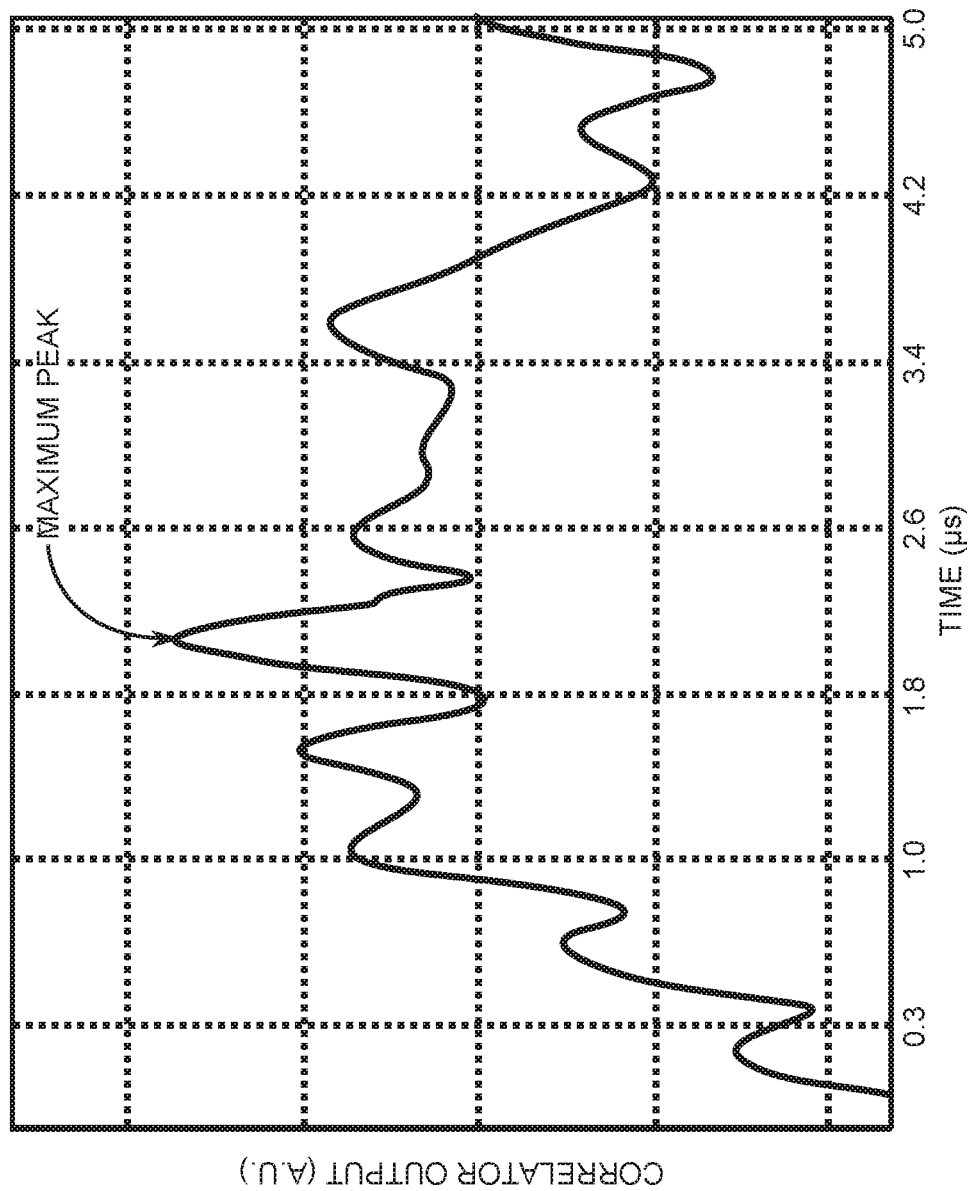
FIG. 6 is a plot of correlator output versus time showing a detection of a maximum peak of magnitude indicating a preamble location in time.

FIG. 6 is a plot of correlator output versus time showing a detection of a maximum peak of the magnitude indicating a preamble location in time. The detection of the maximum peak is indicated to the packet timing synchronizer function 64 as the correlation detection signal shown in FIG. 5.

Figure 7:
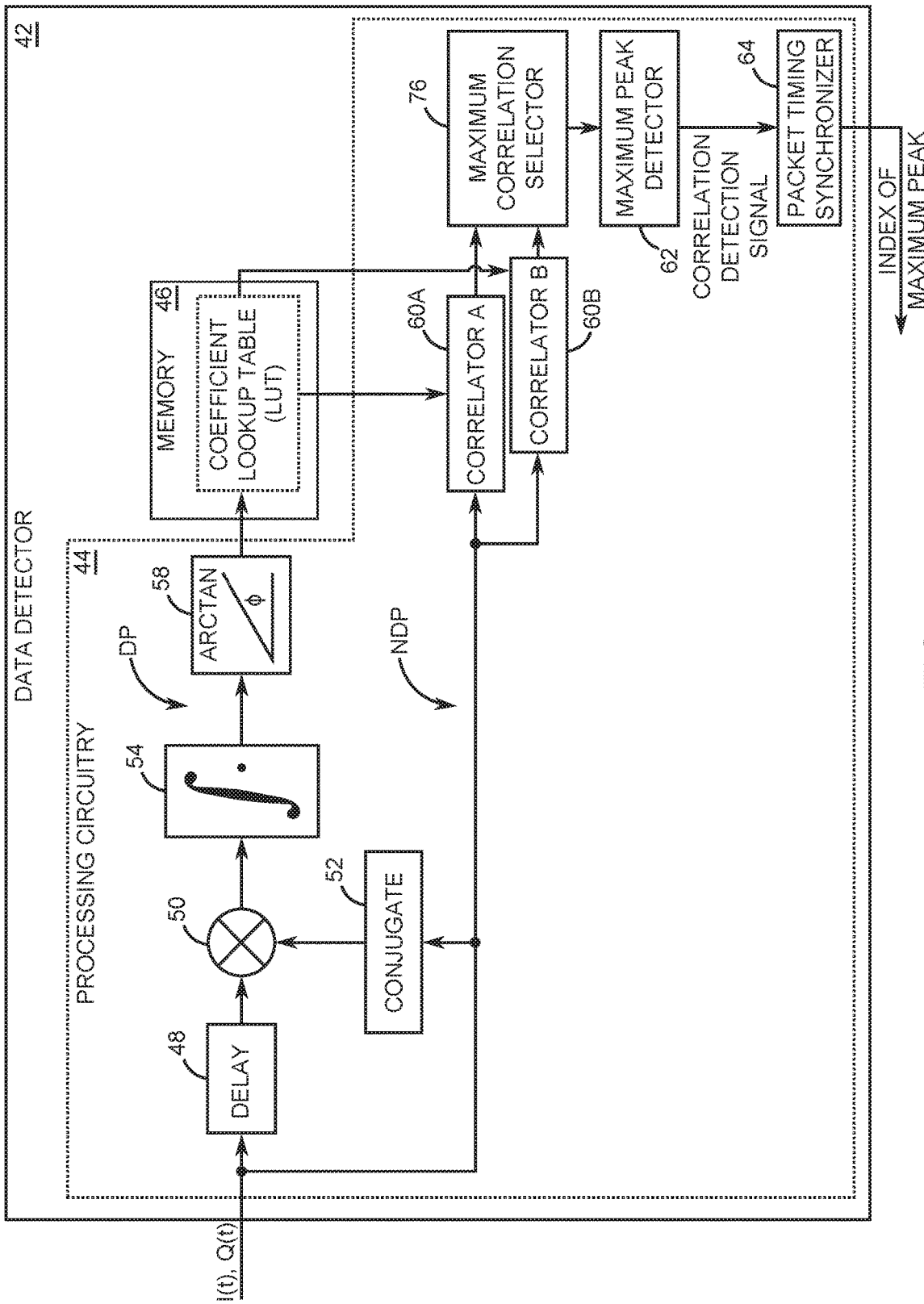
FIG. 7 is a symbolic diagram of another embodiment of the data detector included with the receiver of FIG. 1.

FIG. 7 is a symbolic diagram of another exemplary embodiment of the data detector 42 included with the receiver 10 of FIG. 1. This particular embodiment addresses a case in which an actual offset frequency is located between two adjacent frequency offsets that bound the frequency offset estimate provided by the ARCTAN function 58. In this case, the memory 46 provides a first set of coefficients to a first correlator function 60A for a first frequency offset of a lower frequency offset adjacent to the frequency offset estimate. Substantially simultaneously, the memory 46 provides a second set of coefficients for a second correlator function 60B for a second frequency offset of a higher frequency offset adjacent to the frequency offset estimate. A maximum correlation selector function 76 selects a higher magnitude output from the first correlator function 60A and the second correlator function 60B and then passes the higher magnitude output to the maximum peak detector function 62. In turn, the maximum peak detector function 62 determines the maximum peak of the magnitude as the digital in-phase signal I(t) and the digital quadrature signal Q(t) that are continuously correlated with coefficients passed from the memory 46. The detection of the maximum peak is indicated to the packet timing synchronizer function 64 as the correlation detection signal. In an exemplary embodiment, the packet timing synchronizer function 64 passes an index of the maximum peak to a data packet recovery routine that is executed by a baseband processor (not shown).

At least one benefit of the exemplary embodiments of FIG. 2 and FIG. 7 is low-power packet acquisition provided by employing a minimal number of correlators to generate the correlation detection signal. At least another benefit is a robust detection of the maximum peak of the correlation magnitude despite operating in RF noisy environments caused by Wi-Fi, wireless remote control systems, and wireless telephone systems.

Figure 8:
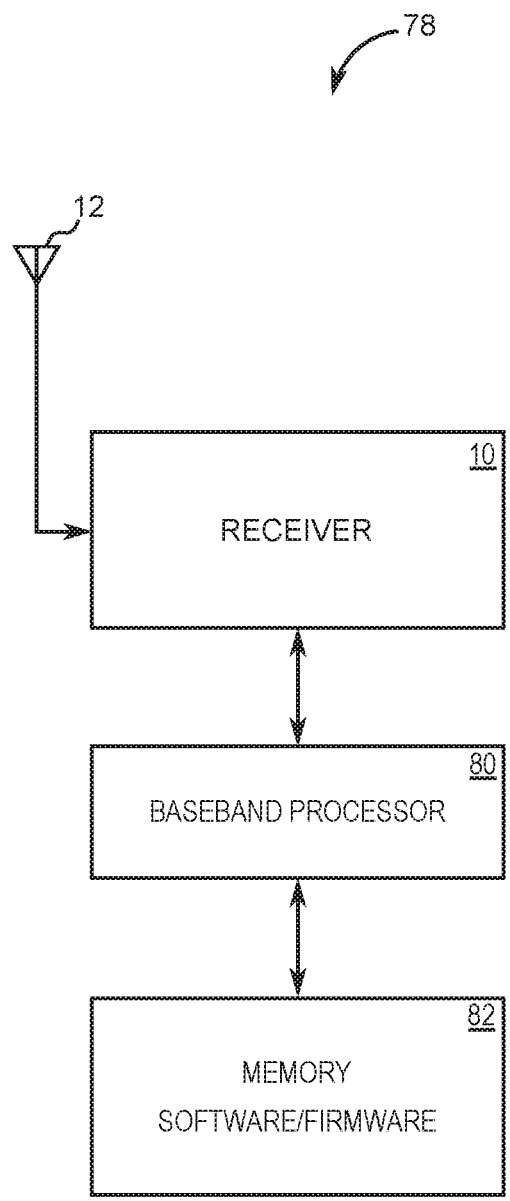
FIG. 8 is a block diagram of an exemplary processor system that includes the exemplary receiver of FIG. 1.

FIG. 8 is a block diagram of an exemplary processor system 78 that includes the receiver 10 and the antenna 12 of FIG. 1. The exemplary processor system 78 includes a baseband processor 80 configured to communicate with the receiver 10. A memory 82 includes software and/or firmware made up of instructions that are executed by the baseband processor to control communication between the baseband processor and the receiver 10. In at least some embodiments, the software and/or firmware is responsive to the packet timing synchronizer function 64 (FIGS. 2, 5, and 7) to recover packets of data and store the packets of data in a memory allocation within the memory 82.

Figure 9:
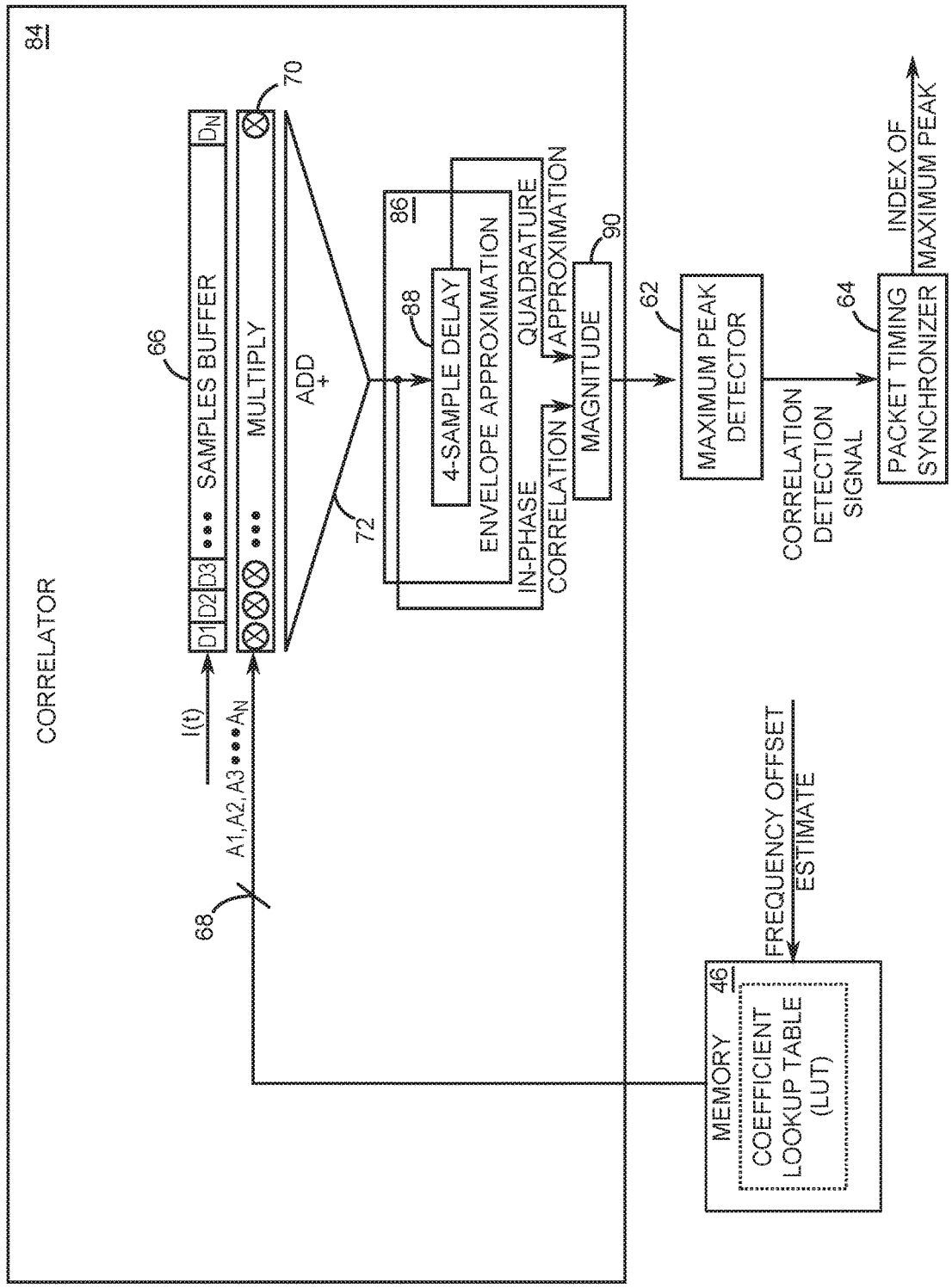
FIG. 9 is a block diagram of an exemplary correlator that provides correlation for an in-phase signal only and provides an envelope approximation that yields an approximation of a quadrature correlation.

FIG. 9 is a block diagram of an exemplary correlator 84 that provides correlation for an in-phase signal only and provides an envelope approximation function 86 that yields an approximation of a quadrature correlation. The exemplary correlator 84 only employs the real part of complex samples $D1-D_N$ and only the in-phase component of complex coefficients $A1-A_N$. A real multiplication operation yields a result of a real part DNI times the real part ANI, wherein N is a natural counting number index. Real multiplication is relatively easier to implement than a full complex multiplication operation. The exemplary correlator 84 approximates the quadrature part by delaying a correlation output by an amount which corresponds to 90 degrees. An exemplary delay for a 32 MHz sampling rate with an intermediate frequency of 2 MHz thus is four samples. This comes from the fact that one quarter of the intermediate frequency period (90 degrees) is 125 ns, and the sampling period is ⅟32 MHz=31.25 ns, which is equivalent to four samples. The envelope approximation function 86 includes a four-sample delay 88. A magnitude function 90 determines the magnitude of an in-phase correlation and the quadrature approximation generated by the envelope approximation function 86. A benefit of the exemplary correlator 84 is a relatively large reduction in implementation complexity in comparison with the correlator function 60 of FIG. 5.

FIG. 10 is a block diagram of an exemplary zero-crossing counter 92 that is employed as a part of the processing circuitry 44 (FIGS. 1, 7) to eliminate a frequency ambiguity associated with a 250 kHz carrier frequency offset (CFO). If the angle of a correlation output is within single digits, the ambiguity is whether the angle is closer to +250 kHz or −250 kHz for a BLE system. The exemplary zero-crossing counter 92 counts a number of zero-crossings over the duration of a preamble. If the number of zero-crossings is greater than a predetermined number (e.g., 32) and trends towards a higher number such as 36, the angle is closer to −250 kHz. In contrast, if the number of zero-crossings is lower than a predetermined number (e.g., 32) and trends towards a lower number such as 28, the angle is closer to +250 kHz. Please see FIG. 11, which is a table that provides a mathematical relationship between zero-crossings and CFO along with exemplary CFOs and expected zero-crossings for exemplary intermediate frequencies. Returning to FIG. 10, the exemplary zero-crossing counter 92 includes an eight-symbol first-in-first-out (FIFO) 94 that is a random access memory location of the processing circuitry 44. The eight-symbol FIFO 94 receives a hard-limited version of the in-phase digital signal. An output of the eight-symbol FIFO 94 feeds a first logic combination made up of a first inverter 96 and a first exclusive OR 98. The first inverter 96 provides an inverted version of the output of the eight-symbol FIFO 94 to the first exclusive OR 98. The first exclusive OR 98 performs an exclusive OR function on both the output and the inverted version of the output of the eight-symbol FIFO 94 to generate a count-down signal CD.

Input to the eight-symbol FIFO 94 is tapped to feed a second logic combination made up of a second inverter 100 and a second exclusive OR 102. The second inverter 100 provides an inverted version of the hard-limited in-phase digital signal to the second exclusive OR 102. The second exclusive OR 102 performs an exclusive OR function on both the hard-limited in-phase digital signal and the inverted version of the hard-limited in-phase digital signal to generate a count-up signal CU. A counter 104 receives both the count-down signal CD and the count-up signal CU. Output from the counter 104 provides a number of zero-crossings in the last eight symbols that propagated through the eight-symbol FIFO 94. As detailed previously, the result of the number of zero-crossings output from the counter 104 is used to determine the polarity of a CFO for a particular intermediate frequency such as those listed in the table of FIG. 11.

Those skilled in the art will recognize improvements and modifications to the preferred embodiments of the present disclosure. All such improvements and modifications are considered within the scope of the concepts disclosed herein and the claims that follow.

What is claimed is:
1. A data detector comprising:
a memory;

processing circuitry interfaced with the memory and configured to:
    receive a digital signal representative of a radio frequency signal in a digital domain;
    generate a frequency offset estimate from the digital signal;
    output the frequency offset estimate to the memory;
    receive output from the memory a set of coefficients of an expected data signal that corresponds to the frequency offset estimate; and
    complex multiply the digital signal by the set of coefficients to generate a set of products.

2. The data detector of claim 1 wherein the digital signal is a digital in-phase signal.

3. The data detector of claim 1 further including a zero-crossing counter that is configured to determine polarity of a carrier frequency offset.

4. The data detector of claim 1 wherein the processing circuitry is further configured to perform a complex summation of the set of products and to determine a magnitude of the complex summation.

5. The data detector of claim 1 wherein the digital signal is a composite signal comprising a digital in-phase signal and a digital quadrature signal, and the set of products comprises a first set of in-phase products and a first set of quadrature products.

6. The data detector of claim 5 wherein the processing circuitry is further configured to perform a complex summation of the first set of in-phase products and the first set of quadrature products.

7. The data detector of claim 5 wherein the processing circuitry is further configured to:
    perform a complex summation of the first set of in-phase products and the first set of quadrature products;
    determine a magnitude of the complex summation; and
    determine a maximum peak of the magnitude.

8. The data detector of claim 5 wherein the memory is in a delayed path that includes a delay function that delays the digital in-phase signal and the digital quadrature signal by a predetermined number of symbols within a preamble of a data packet carried by the radio frequency signal.

9. The data detector of claim 5 wherein the processing circuitry is further configured to:
    generate a conjugate of the digital in-phase signal and of the digital quadrature signal routed from a non-delayed path; and
    multiply the conjugate of the digital in-phase signal and of the digital quadrature signal by delayed versions of digital in-phase signal and the digital quadrature signal to generate multiplied versions of the digital in-phase signal and the digital quadrature signal.

10. The data detector of claim 5 wherein the memory is further configured to output a second set of in-phase coefficients of a second expected data signal and a second set of quadrature coefficients of the second expected data signal that each corresponds to the frequency offset estimate.

11. The data detector of claim 6 wherein the processing circuitry is further configured to determine a magnitude of the complex summation of the first set of in-phase products and the first set of quadrature products.

12. The data detector of claim 8 wherein the predetermined number of symbols is two.

13. The data detector of claim 8 wherein the predetermined number of symbols equals a delay of 2 microseconds.

14. The data detector of claim 8 wherein the preamble is for a Bluetooth Low Energy data stream.

15. The data detector of claim 9 wherein the processing circuitry is further configured to integrate the multiplied versions of the digital in-phase signal and of the digital quadrature signal over a predetermined time interval to generate integrated versions of the multiplied versions of the digital in-phase signal and of the digital quadrature signal.

16. The data detector of claim 10 wherein the processing circuitry is further configured to:
    multiply the digital in-phase signal by the second set of in-phase coefficients to generate a second set of in-phase products; and
    multiply the digital quadrature signal by the second set of quadrature coefficients to generate a second set of quadrature products.

17. The data detector of claim 15 wherein the predetermined time interval is equal to a duration of a preamble of a Bluetooth Low Energy data stream.

18. The data detector of claim 15 wherein the processing circuitry is further configured to determine the frequency offset estimate from the integrated versions of the multiplied versions of the digital in-phase signal and of the digital quadrature signal.

19. The data detector of claim 16 wherein the processing circuitry is further configured to determine a largest one of a first magnitude of a complex summation of the first set of in-phase products and of the first set of quadrature products and a second magnitude of the complex summation of the second set of in-phase products and of the second set of quadrature products.

20. The data detector of claim 18 wherein the processing circuitry determines the frequency offset estimate by calculating the arctangent of the integrated versions of the multiplied versions of the digital in-phase signal and of the digital quadrature signal.

21. The data detector of claim 19 wherein the data detector is integrated with a receiver having an in-phase path that includes a first analog-to-digital converter that generates the digital in-phase signal and a quadrature path that includes a second analog-to-digital converter that generates the digital quadrature signal.

22. The data detector of claim 19 wherein the data detector is integrated with a receiver that includes an analog-to-digital converter that is a hard limiter that quantizes received signals to logic 1 and logic 0 values.

23. The data detector of claim 22 wherein the receiver is coupled with a baseband processor configured to communicate with both the receiver and a memory that includes software and/or firmware made up of instructions that are executed by the baseband processor to control communication between the baseband processor and the receiver.

24. The data detector of claim 23 wherein the processing circuitry is further configured to pass an index of a maximum peak of the largest one of the first magnitude and second magnitude of the complex summation to a data packet recovery routine that is executed by the baseband processor.

25. The data detector of claim 24 wherein the software and/or firmware is responsive to a packet timing synchronizer to recover packets of data and store the packets of data in a memory allocation within the memory.

* * * * *

UNITED STATES PATENT AND TRADEMARK OFFICE
CERTIFICATE OF CORRECTION

PATENT NO. : 10,667,102 B2
APPLICATION NO. : 15/825294
DATED : May 26, 2020
INVENTOR(S) : Andrew Fort Page 1 of 1

It is certified that error appears in the above-identified patent and that said Letters Patent is hereby corrected as shown below:

In the Specification

Column 5, Lines 25 and 27, replace "I/O samples" with --I/Q samples--.

Signed and Sealed this
Seventh Day of July, 2020

Andrei Iancu
*Director of the United States Patent and Trademark Office*